(12) United States Patent
Asano

(10) Patent No.: US 9,171,107 B2
(45) Date of Patent: Oct. 27, 2015

(54) CALCULATING METHOD OF STRUCTURAL DATA OF DIFFRACTIVE OPTICAL ELEMENT, PROGRAM, AND MANUFACTURING METHOD

(71) Applicant: CANON KABUSHIKI KAISHA, Tokyo (JP)

(72) Inventor: Kosuke Asano, Utsunomiya (JP)

(73) Assignee: CANON KABUSHIKI KAISHA (JP)

( * ) Notice: Subject to any disclaimer, the term of this patent is extended or adjusted under 35 U.S.C. 154(b) by 341 days.

(21) Appl. No.: 13/787,971

(22) Filed: Mar. 7, 2013

(65) Prior Publication Data

US 2013/0238296 A1   Sep. 12, 2013

(30) Foreign Application Priority Data

Mar. 8, 2012   (JP) .................................. 2012-052360

(51) Int. Cl.
*G06F 17/50* (2006.01)
*G06F 17/14* (2006.01)
*G03F 7/20* (2006.01)

(52) U.S. Cl.
CPC ............... *G06F 17/50* (2013.01); *G03F 7/705* (2013.01); *G03F 7/70108* (2013.01); *G03F 7/70158* (2013.01); *G06F 17/14* (2013.01); *G06F 17/5036* (2013.01)

(58) Field of Classification Search
USPC ........................... 703/2, 18; 356/450; 359/568
See application file for complete search history.

(56) References Cited

U.S. PATENT DOCUMENTS

| | | | | |
|---|---|---|---|---|
| 5,610,897 A | * | 3/1997 | Yamamoto et al. | 369/124.03 |
| 8,502,962 B2 | * | 8/2013 | Kawashima et al. | 355/77 |
| 8,773,599 B2 | * | 7/2014 | Saeedi et al. | 349/11 |
| 2011/0122394 A1 | * | 5/2011 | Kawashima et al. | 355/77 |
| 2013/0094027 A1 | * | 4/2013 | Iwai et al. | 356/450 |
| 2013/0100362 A1 | * | 4/2013 | Saeedi et al. | 349/11 |

FOREIGN PATENT DOCUMENTS

| | | |
|---|---|---|
| JP | 07-201697 A | 8/1995 |
| JP | 2002-221614 A | 8/2002 |

OTHER PUBLICATIONS

Wyrowski, Frank, "Diffractive Optical Elements: Iterative Calculation of Quantized, Blazed Phase Structures", J. Opt. Am. A., vol. 7, No. 6, Jun. 1990, pp. 961-969.

* cited by examiner

*Primary Examiner* — Thai Phan
(74) *Attorney, Agent, or Firm* — Rossi, Kimms & McDowell LLP

(57) ABSTRACT

A calculating method for calculating structural data of a two-level diffractive optical element configured to form a set of light intensity distributions point-symmetrical with respect to an axis on an image plane utilizing an iterative Fourier transform algorithm executed by a computer includes calculating a light intensity distribution and a phase distribution of a plane of the two-level diffractive optical element which has a Fourier transform relationship with the image plane by performing an inverse Fourier transform for a light intensity that is made by removing one of the set of light intensity distributions from the set of light intensity distributions, and calculating structural data of the diffractive optical element based upon the light intensity distribution and the phase distribution which have been calculated.

5 Claims, 10 Drawing Sheets

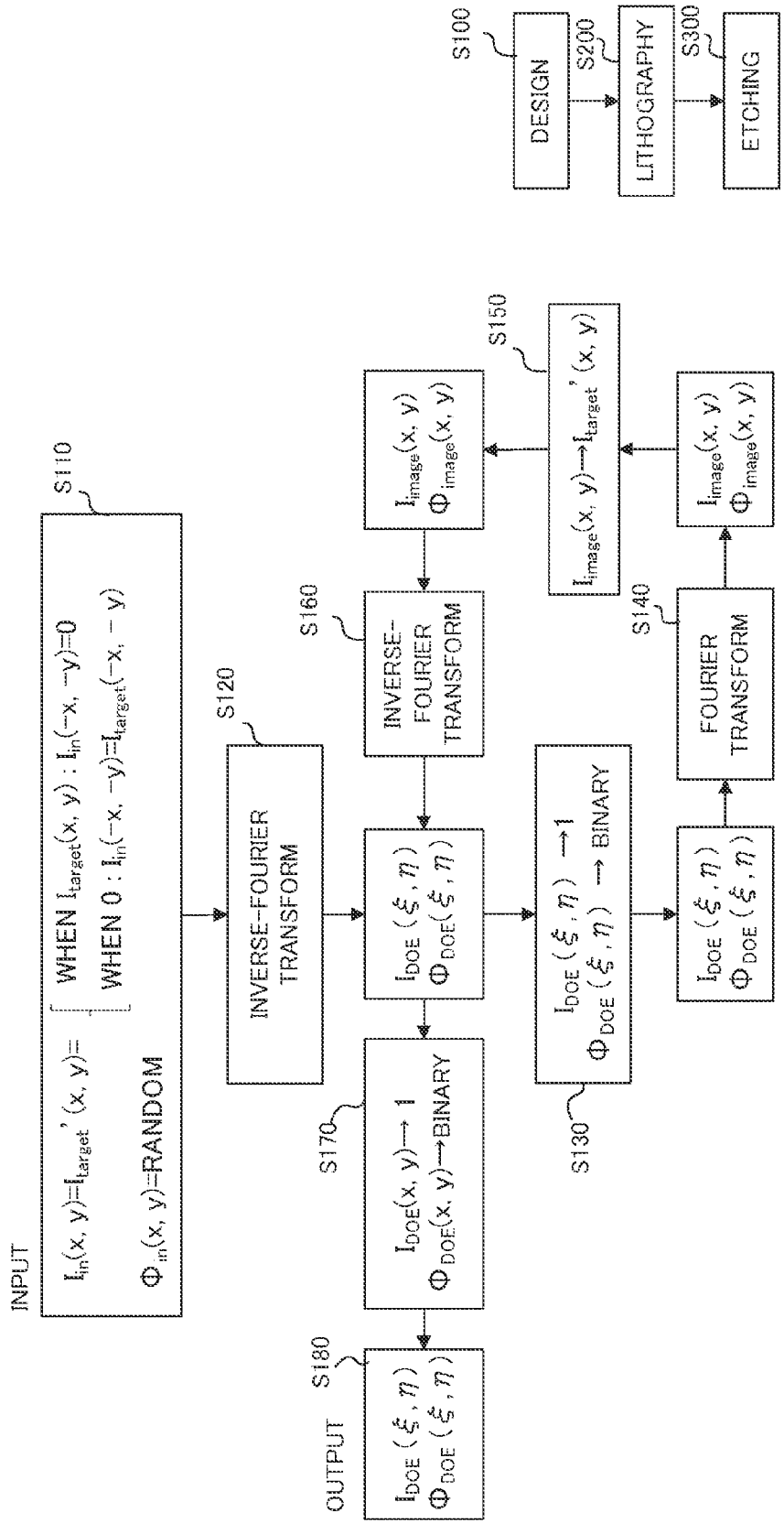

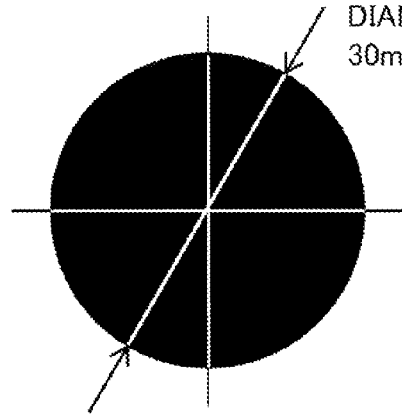
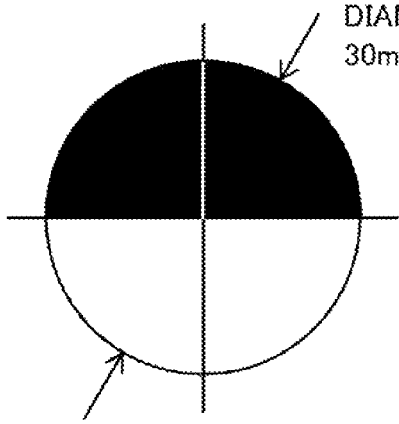
FIG. 5A
FIG. 5B

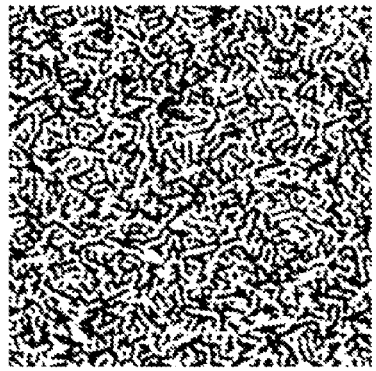
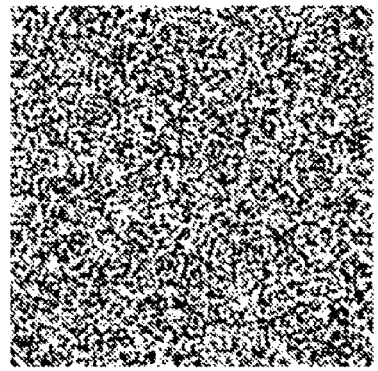
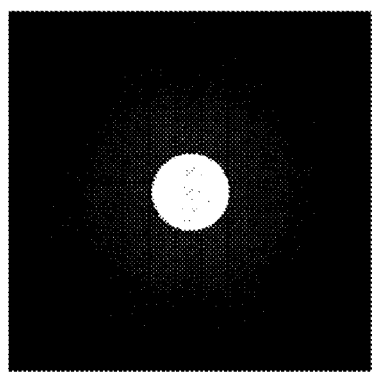
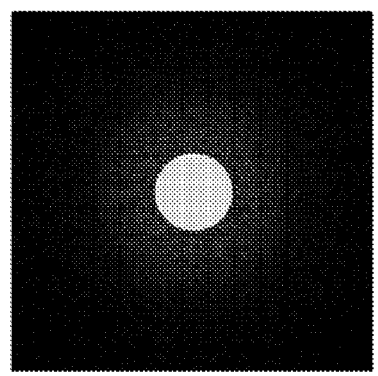
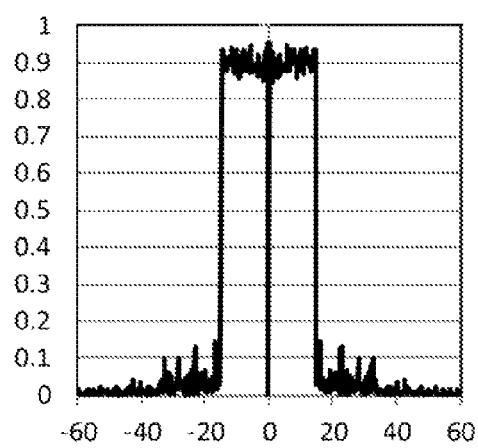
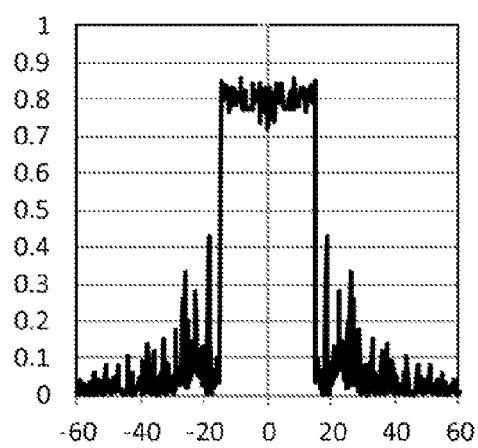
FIG. 6A　　　　　　　　FIG. 6B

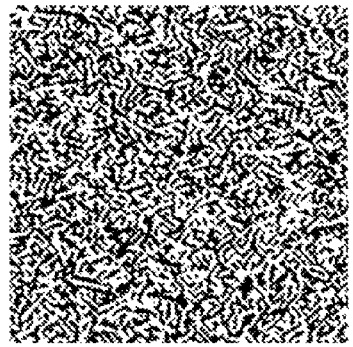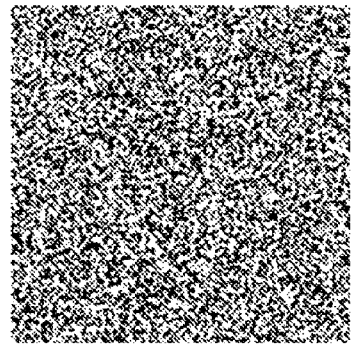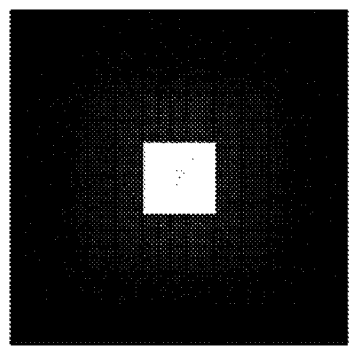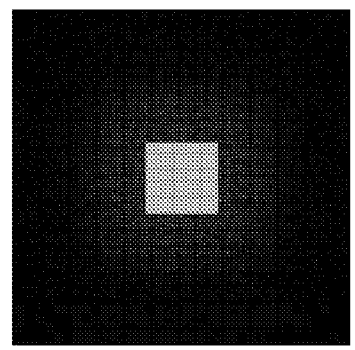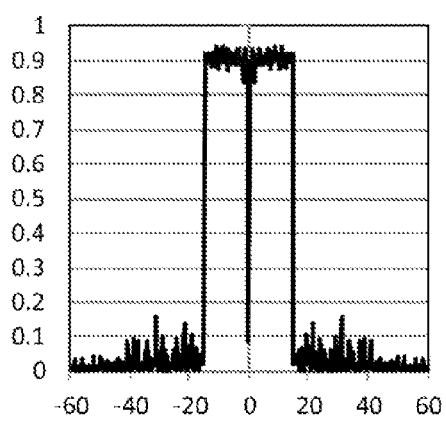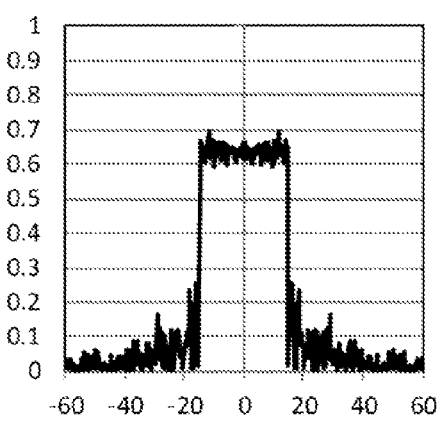
FIG. 8A                FIG. 8B

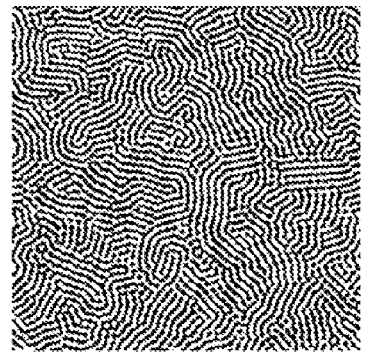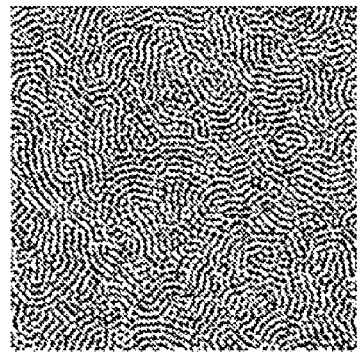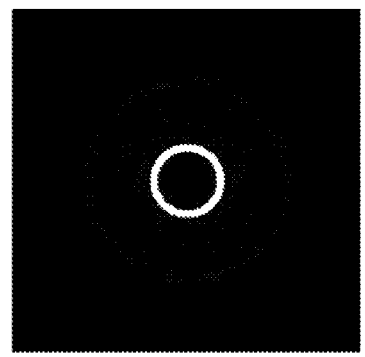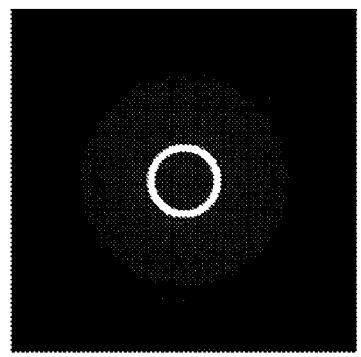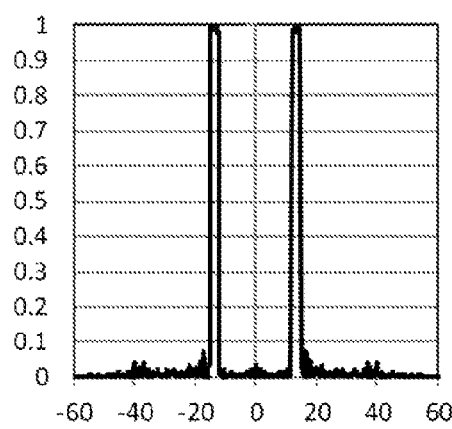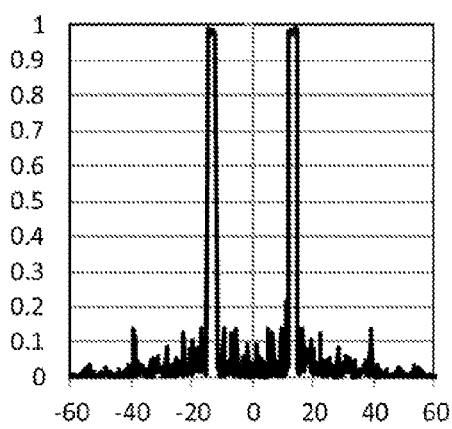
FIG. 10A　　　　　　　FIG. 10B

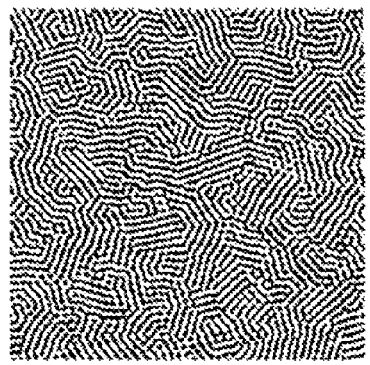
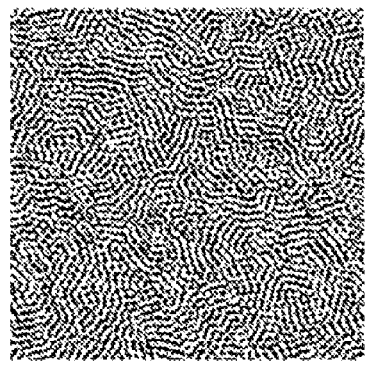
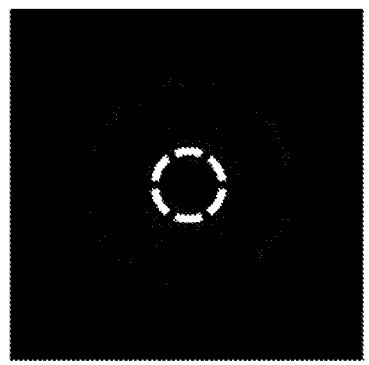
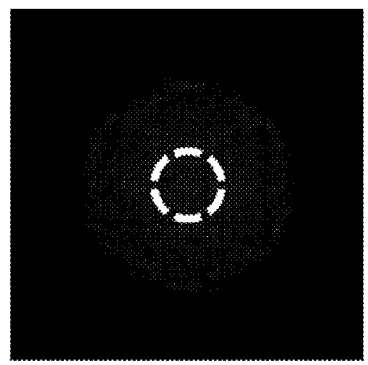
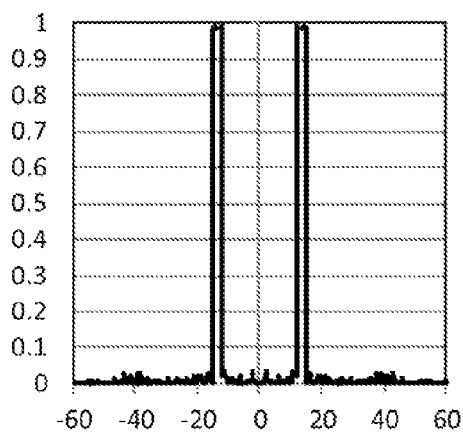
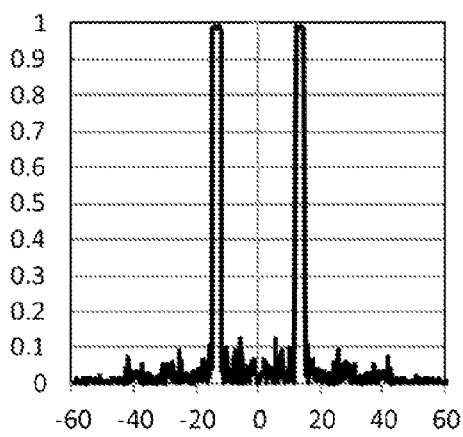
FIG. 12A  FIG. 12B

CALCULATING METHOD OF STRUCTURAL DATA OF DIFFRACTIVE OPTICAL ELEMENT, PROGRAM, AND MANUFACTURING METHOD

BACKGROUND OF THE INVENTION

1. Field of the Invention

The present invention relates to a manufacturing method of a diffractive optical element ("DOE"). The DOE of the present invention is suitable for a semiconductor exposure apparatus, a laser processing apparatus, etc.

2. Description of the Related Art

In a conventional semiconductor exposure apparatus, a DOE is used for an illumination optical system configured to provide an off-axis illumination that improves the resolution (Japanese Patent Laid-Open No. ("JP") 7-201697). In a laser processing apparatus, the DOE is used for a beam shaper and a beam splitter so as to improve the processing precision and the throughput (JP 2002-221614). The DOE is an optical element made by forming a micro relief structure shape on a transparent substrate. The phase of light that has transmitted the DOE is modulated by a phase distribution that is generated by a difference between a refractive index of a substrate material and a refractive index of air, and converted into a predetermined intensity distribution.

In general, the convexoconcave shape of the DOE is formed by repeating the lithography and etching. A $2^n$-level (step) structure is manufactured by repeating the lithography and etching n times: The first set of the lithography and the etching provides a two-level structure, and the second set of the lithography and the etching provides a four-stage structure. An optical function having a higher performance can be obtained by increasing the number of stages. However, the increased number of stages would increase the manufacturing cost. In order to restrain the manufacturing cost, the two-level DOE that can provide an intended optical function is demanded.

It is well-known that an iterative Fourier transform algorithm ("IFTA"), which is one of designing methods of the DOE, has a high convergent speed (Frank Wyrowski, "Diffractive optical elements: iterative calculation of quantized, blazed phase structures," J. Opt. Soc. Am. A, 7, p. 961-969 (1990)).

When the DOE is used for the semiconductor exposure apparatus or the laser processing apparatus, the DOE is often applied to an optical system configured to form a reproduced image on the optical axis. In this case, the reproduced image often has an intensity distribution point-symmetrical with respect to the optical axis, and it is difficult to sufficiently improve the diffraction efficiency of the IFTA-designed, two-level DOE and to sufficiently reduce its noises.

SUMMARY OF THE INVENTION

The present invention provides a calculating method of structural data of a diffractive optical element, a program, and a manufacturing method, each of which utilizes an IFTA so as to reproduce a light intensity distribution point-symmetrical with respect to an optical axis with a high diffraction efficiency and reduced noises.

A calculating method according to the present invention for calculating structural data of a two-level diffractive optical element configured to form a set of light intensity distributions point-symmetrical with respect to an axis on an image plane utilizing an iterative Fourier transform algorithm executed by a computer includes a first step of calculating a light intensity distribution and a phase distribution of a plane of the two-level diffractive optical element which has a Fourier transform relationship with the image plane by performing an inverse Fourier transform for a light intensity that is made by removing one of the set of light intensity distributions from the set of light intensity distributions, and a second step of calculating structural data of the diffractive optical element based upon the light intensity distribution and the phase distribution which have been calculated.

Further features of the present invention will become apparent from the following description of exemplary embodiments with reference to the attached drawings.

BRIEF DESCRIPTION OF THE DRAWINGS

FIGS. 1A and 1B are flowcharts used to explain a manufacturing method of a diffractive optical element according to this embodiment.

FIGS. 5A and 5B views of a relationship between a target light intensity distribution on an image plane and a light intensity distribution that is a target of an inverse-Fourier transform according to a second embodiment.

FIGS. 6A and 6B are results that compare a manufacturing method according to the second embodiment of the present invention and the conventional manufacturing method.

FIGS. 8A and 8B are results that compare a manufacturing method according to the third embodiment of the present invention and the conventional manufacturing method.

FIGS. 10A and 10B are results that compare a manufacturing method according to the fourth embodiment of the present invention and the conventional manufacturing method.

FIGS. 12A and 12B are results that compare a manufacturing method according to the fifth embodiment of the present invention and the conventional manufacturing method.

DESCRIPTION OF THE EMBODIMENTS

Figure 4A:
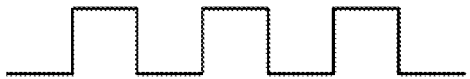
FIGS. 4A-4C are sectional views of diffractive optical elements according to this embodiment.
Figure 4B:
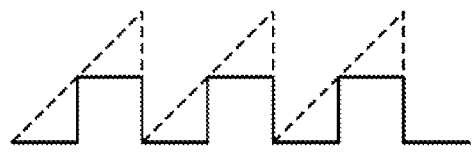
Figure 4C:
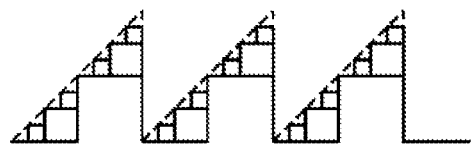

The diffractive optical element ("DOE") 10 according to this embodiment has two-levels, and has a sectional shape in which rectangular convexes and concaves are periodically arranged as illustrated in FIG. 4A. The DOE illustrated in FIG. 4A can be considered to have a pattern made by approximating a grating pattern having a sectional shape of a sawtooth shape (triangular shape) illustrated by a dotted line in FIG. 4B. Thus, by increasing the number of stages as illustrated in FIG. 4C, the shape becomes closer to the saw-tooth shape and the optical function having a higher performance can be obtained.

However, as the number of stages increases, the manufacturing cost increases. Thus, this embodiment utilizes the two-level DOE illustrated in FIG. 4A and the iterative Fourier transform algorithm ("IFTA") so as to quickly design a shape of the DOE. The DOE of this embodiment is made by, but is not limited to, a Computer Generated Hologram ("CGH").

When the two-level DOE is used for an optical system configured to form a reproduced image on the optical axis, it is difficult to sufficiently improve a diffraction efficiency. In order to solve this problem, a description will now be given of a method for calculating structural data of the DOE and for quickly designing a shape of the two-level DOE utilizing the IFTA and a program of the method.

Now assume diffracted light on an image plane when plane light wave incidents normally the DOE. When $u_{DOE}(\xi,\eta)$ is a distribution of light on the DOE plane, and $u_{image}(x,y)$ is a distribution of light on the image plane. Then, the following expressions are established:

$$u_{DOE}(\xi,\eta) = A_{DOE}(\xi,\eta)\exp[i\Phi_{DOE}(\xi,\eta)]$$

$$u_{image}(x,y) = A_{image}(x,y)\exp[i\Phi_{image}(x,y)]$$

$$I_{DOE}(\xi,\eta) = |A_{DOE}(\xi,\eta)|^2$$

$$I_{image}(x,y) = |A_{image}(x,y)|^2$$

Herein, $A_{DOE}(\xi,\eta)$, $\Phi_{DOE}(\xi,\eta)$, and $I_{DOE}(\xi,\eta)$ are the amplitude distribution, the phase distribution, and the intensity distribution on the DOE plane, respectively. $A_{image}(x,y)$, $\Phi_{image}(x,y)$, and $I_{image}(x,y)$ are the amplitude distribution, the phase distribution, and the light intensity distribution on the image plane, respectively. Since the DOE plane has a Fourier transform relationship with the image plane, the following expressions are established:

$$u_{DOE}(\xi,\eta) = \int_{-\infty}^{\infty}\int u_{image}(x,y)\exp[-i(\xi x+\eta y)]dxdy \quad \text{[Expression 1]}$$

$$u_{image}(x,y) = \int_{-\infty}^{\infty}\int u_{DOE}(\xi,\eta)\exp[+i(\xi x+\eta y)]d\xi d\eta \quad \text{[Expression 2]}$$

A description will now be given of a manufacturing method of a DOE with reference to flowcharts illustrated in FIGS. 1A and 1B. In FIGS. 1A and 1B, "S" stands for a step. FIG. 1B is a flowchart for explaining the manufacturing method of the DOE according to this embodiment.

As illustrated in FIG. 1B, the manufacturing method of the DOE according to this embodiment includes a designing step S100, a lithography step S200, and an etching step S300. The designing step S100 is a step for designing the two-level DOE using the computer and IFTA, and the details are illustrated in FIG. 1A. Since this embodiment manufactures the two-level DOE, the lithography step S200 and the etching step S300 are performed once each.

The flowchart illustrated in FIG. 1A can be implemented as a program (software such as a design tool) which enables the computer (processor) to execute a function of each step. Referring now to FIG. 1A, a description will be given of the DOE manufacturing method and the program according to this embodiment which enables the computer to execute that method.

In S110, the computer receives an input of a target intensity distribution $I_{target}'(x,y)$ on the image plane as the light intensity distribution $I_{in}(x,y)$. In addition, the computer receives an input of a random phase distribution $\Phi_{in}(x,y)$ as an initial input.

Conventionally, the light distribution $u_{DOE}(\xi,\eta)$ on the DOE plane is obtained based upon the expression 1 when the point-symmetrical light intensity distribution is necessary on the image plane of the imaging optical system. In other words, in the conventional input step, $I_{in}(x,y)=I_{target}(x,y)$ is established. $\Phi_{in}(x,y)$ is a random phase distribution similar to this embodiment.

However, as the two-level DOE is applied to an optical system configured to form a reproduced image on the optical axis, $\pm 1^{st}$ order diffracted light fluxes occur. When a point-symmetrical intensity distribution is set on the DOE plane, $-1^{st}$ order diffracted light flux interferes with the $+1^{st}$ order diffracted light flux although only the $+1^{st}$ order diffracted light is originally used to form an image. As a result, the diffraction efficiency lowers and noises occur.

In other words, the point-symmetrical light intensity distribution $I_{target}(x,y)$ on the image plane is characterized by $I_{target}(-x,-y)=I_{target}(x,y)$, and the $I_{target}(x,y)$ that is point-symmetrical with respect to the optical axis is a design object in this embodiment. This embodiment determines the light intensity distribution and phase distribution on the DOE plane by performing the inverse Fourier transform for the light intensity distribution in which one of the light intensity distributions is removed when there are point-symmetrical light intensity distributions on the image plane of the optical system.

In this embodiment, $I_{in}(x,y)=I_{target}(x,y)=0$ when $I_{target}'(-x,-y)=I_{target}(x,y)$ and $I_{in}(x,y)=I_{target}(x,y)$ when $I_{target}(-x,-y)=0$.

When the set of light intensity distributions that are point-symmetrical on the image plane of the imaging optical system is input into the computer, the processing of removing one of the set of light intensity distributions may be automatically performed.

Next, in S120, the computer performs an inverse Fourier transform for the light intensity $I_{in}(x,y)$ in which one of the light intensity distributions is removed from the set of light intensity distributions, and the computer calculates the light intensity distribution $I_{DOE}(\xi,\eta)$ and the phase distribution $\Phi_{DOE}(\xi,\eta)$ on the DOE plane that has a Fourier transform relationship with the image plane.

Next, in S130, the computer provides a constraint condition so as to set the light intensity distribution $I_{DOE}(\xi,\eta)$ on the DOE plane to 1 and to make the phase distribution $_{DOE}(\xi,\eta)$ binary.

Next, in S140, the computer performs a Fourier transform for the light intensity distribution $I_{DOE}(\xi,\eta)$ and the phase distribution $\Phi_{DOE}(\xi,\eta)$, and calculates the light intensity distribution $I_{image}(x,y)$ and phase distribution $\Phi_{image}(x,y)$ on the image plane.

Next, in S150, the computer provides a constraint condition so as to set the light intensity distribution $I_{image}(x,y)$ to the target intensity distribution $I_{target}'(x,y)$.

Next, in S160, the computer calculates the intensity distribution $I_{DOE}(\xi,\eta)$ and phase distribution $\Phi_{DOE}(\xi,\eta)$ on the DOE plane using the inverse Fourier transform.

Thereafter, the computer repeats S130 to S160 a predetermined number of times.

Next, in S170, the computer provides a constraint condition so as to set the intensity distribution $I_{DOE}(\xi,\eta)$ on the DOE plane to 1 and to make the phase distribution $\Phi_{DOE}(\xi,\eta)$ binary. In S180, the computer outputs the phase distribution $\Phi_{DOE}(\xi,\eta)$ of the DOE.

Then, the computer calculates the structural data of the convexes and concaves of the DOE which realizes the intensity distribution and phase distribution on the DOE. The calculation may utilize a well-known method. The data is input into a processing machine, and the DOE is manufactured utilizing the processing machine so as to obtain that data structure. The manufacturing method can utilize a known method, such as the lithography and etching.

First Embodiment

Figure 2A:
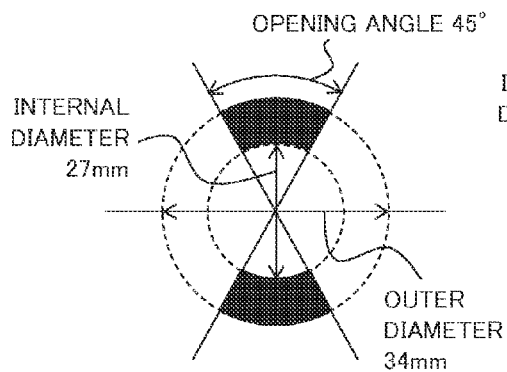
FIGS. 2A and 2B are views of a relationship between a target light intensity distribution on an image plane and a light intensity distribution that is a target of an inverse-Fourier transform according to the first embodiment.

Assume that the target light intensity distribution has a set of light intensity distributions on the image plane of the optical system, which are point-symmetrical with respect to the optical axis of the optical system, as illustrated in FIG. 2A. A black part is a light-transmitting part, and a white part is a light-shielding part. An opening angle of 45°, an internal diameter of 27 mm, and an outer diameter of 34 mm are merely illustrative.

A set of point-symmetrical light intensity distributions forms, but is not limited to, a dipole in FIG. 2A. For example, this embodiment is applicable to any even-number sets, such as a quadrupole, and a continuous light intensity distribution such as an annulus and a cross shape, as long as it can be divided into an upper part and a lower part in FIG. 2A.

Figure 2B:
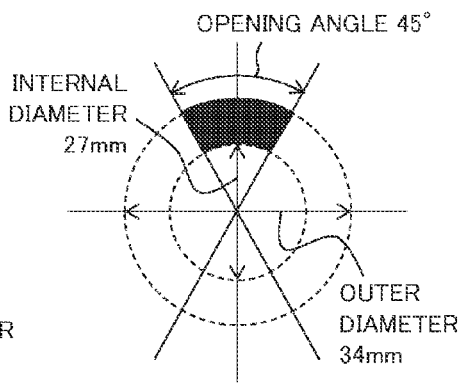

According to the conventional design step, the computer acquires a light intensity distribution and a phase distribution on the DOE plane through an inverse Fourier transform to the light intensity distribution $I_{in}(x,y)$ that contains both light intensity distributions illustrated in FIG. 2A in S120. On the other hand, as illustrated in FIG. 2B, according to the designing step S100 of this embodiment, the computer acquires a light intensity distribution and a phase distribution on the DOE plane through an inverse Fourier transform to the light intensity distribution that contains only one of the light intensity distributions in S120.

This embodiment designs a DOE (CGH) that provides the DOE plane and the image plane with a 2f system, utilizing the IFTA. A service wavelength of a light source is 193 nm, a focal length of a Fourier transform lens is 237.7 nm, the number of pixels of the DOE is 1,024 pixels×1,024 pixels, and the size of the unit pixel of the DOE is 150 nm.

Figure 3A:
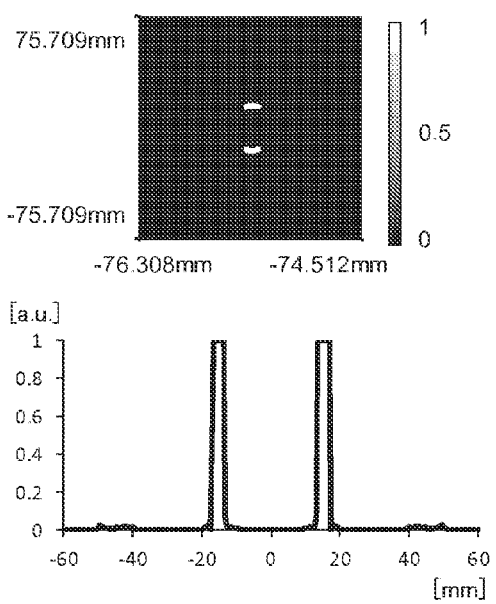
FIGS. 3A and 3B are results that compare a manufacturing method according to the first embodiment of the present invention and a conventional manufacturing method.
Figure 3B:
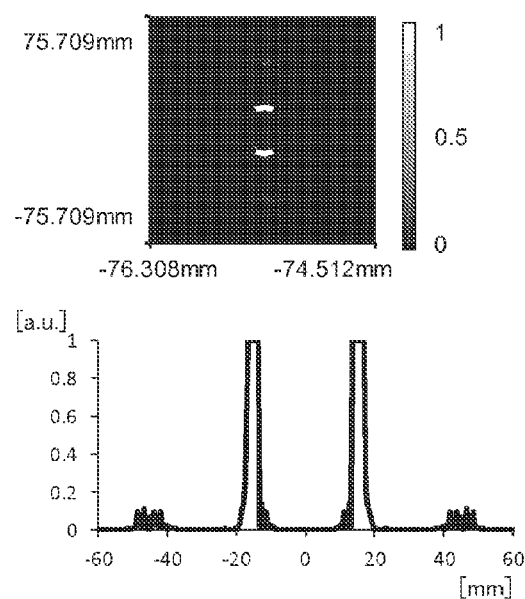

FIG. 3A is a result produced by the designing step S100 according to this embodiment, and FIG. 3B is a result produced by the conventional designing method. In FIGS. 3A and 3B, the top views illustrate light intensity distributions on the image plane: A black part is a light-shielding part, and a white part is a light-transmitting part (illuminated part). Thus, in each of FIGS. 3A and 3B, a set of light intensity distributions that are point-symmetrical with respect to the optical axis on the image plane is reproduced, and a dipole modified illumination is obtained. However, as illustrated in the bottom views of FIGS. 3A and 3B, their light intensity distributions are different from each other. In the bottom views (graphs) in FIGS. 3A and 3B, the abscissa axis denotes a longitudinal sectional position by setting the center of the top view of each of FIGS. 3A and 3B to the origin and the unit is millimeter. The ordinate axis denotes a light intensity distribution normalized to 1 with an arbitrary unit. It is understood that there are two peaks corresponding to the dipole.

It is understood that there are many noises in the bottom graph in FIG. 3B, and a leading edge or a trailing edge of the peak of the light intensity distribution deform. The diffraction efficiency is 55% in the conventional designing method and 75% in the designing method according to this embodiment. It is therefore understood that the diffraction efficiency of this embodiment is superior.

It is clear from the above result that this embodiment can provide the two-level DOE configured to efficiently reproduce light intensity distributions point-symmetrical with respect to the optical axis on the image plane with reduced noises.

Second Embodiment

Assume that the target light intensity distribution has a set of (e.g., upper and lower semicircular) light intensity distributions (forming a circle) on the image plane of the optical system, which are point symmetrical with respect to the optical axis of the optical system, as illustrated in FIG. 5A. A black part is a light-transmitting part, and a white part is a light-shielding part. An outer diameter of 30 mm is merely illustrative.

According to the conventional design step, the computer acquires a light intensity distribution and a phase distribution on the DOE plane through an inverse Fourier transform to the light intensity distribution $I_{in}(x,y)$ that contains both light intensity distributions illustrated in FIG. 5A in S120. On the other hand, as illustrated in FIG. 5B, according to the designing step S100 of this embodiment, the computer acquires a light intensity distribution and a phase distribution on the DOE plane through an inverse Fourier transform to the light intensity distribution that contains only one of the light intensity distributions in S120.

This embodiment designs a DOE (CGH) that provides the DOE plane and the image plane with a 2f system, utilizing the IFTA. A service wavelength of the light source is 350 nm, a focal length of the Fourier transform lens is 100 nm, the number of pixels of the DOE is 512 pixels×512 pixels, and the size of the unit pixel of the DOE is 250 nm.

FIG. 6A is a result produced by the designing step S100 according to this embodiment, and FIG. 6B is a result produced by the conventional designing method. In FIGS. 6A and 6B, the top views illustrate phase distributions formed by the DOE. It is visually confirmed that they are different from each other when the result produced by the designing method according to this embodiment is compared with the result produced by the conventional designing method. In FIGS. 6A and 6B, the middle views illustrate light intensity distributions on the image plane (pupil plane of the illumination optical system): A black part is a light-shielding part, and a white part is a light-transmitting part (illuminated part). Thus, in each of FIGS. 6A and 6B, a set of light intensity distributions that are point-symmetrical with respect to the optical axis on the image plane is reproduced, and a circular modified illumination is obtained. However, as illustrated in the bottom views of FIGS. 6A and 6B, their light intensity distributions are different from each other. In the bottom views (graphs) in FIGS. 6A and 6B, the abscissa axis denotes a longitudinal sectional position by setting the center of the middle view of each of FIGS. 6A and 6B to the origin and the unit is millimeter. The ordinate axis denotes a light intensity distribution normalized to 1 with an arbitrary unit. It is understood that there is a peak corresponding to the center of the circle.

It is understood that there are many noises in the bottom graph in FIG. 6B, and a leading edge or a trailing edge of the peak of the light intensity distribution deform. The diffraction efficiency is 52% in the conventional designing method and 74% in the designing method according to this embodiment. It is therefore understood that the diffraction efficiency of this embodiment is superior.

It is clear from the above result that this embodiment can provide the two-level DOE configured to efficiently reproduce light intensity distributions point-symmetrical with respect to the optical axis on the image plane with reduced noises.

Third Embodiment

Figure 7A:
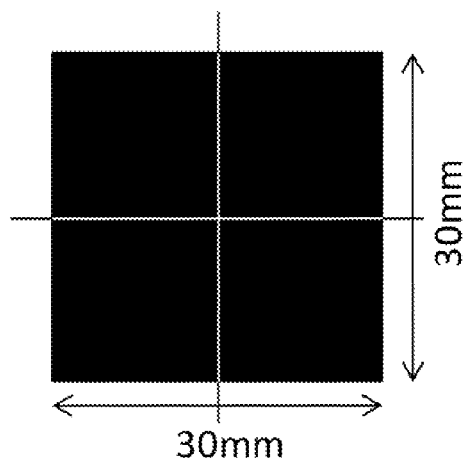
FIGS. 7A and 7B views of a relationship between a target light intensity distribution on an image plane and a light intensity distribution that is a target of an inverse-Fourier transform according to a third embodiment.

Assume that the target light intensity distribution has a set of (e.g., upper and lower rectangular) light intensity distributions (forming a square) on the image plane of the optical system, which are point symmetrical with respect to the optical axis of the optical system, as illustrated in FIG. 7A. A black part is a light-transmitting part, and a white part is a light-shielding part. A length of one side of 30 mm is merely illustrative.

Figure 7B:
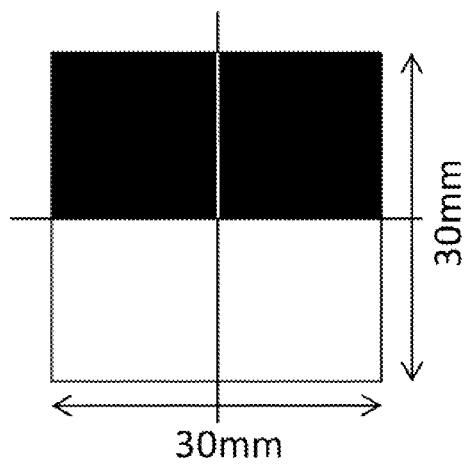

According to the conventional design step, the computer acquires a light intensity distribution and a phase distribution on the DOE plane through an inverse Fourier transform to the light intensity distribution $I_{in}(x,y)$ that contains both light intensity distributions illustrated in FIG. 7A in S120. On the other hand, as illustrated in FIG. 7B, according to the designing step S100 of this embodiment, the computer acquires a light intensity distribution and a phase distribution on the DOE plane through an inverse Fourier transform to the light intensity distribution that contains only one of the light intensity distributions in S120.

This embodiment designs a DOE (CGH) that provides the DOE plane and the image plane with a 2f system, utilizing the IFTA. A service wavelength of the light source is 350 nm, a focal length of the Fourier transform lens is 100 nm, the number of pixels of the DOE is 512 pixels×512 pixels, and the size of the unit pixel of the DOE is 250 nm.

FIG. 8A is a result produced by the designing step S100 according to this embodiment, and FIG. 8B is a result produced by the conventional designing method. In FIGS. 8A and 8B, the top views illustrate phase distributions formed by the DOE. It is visually confirmed that they are different from each other when the result produced by the designing method according to this embodiment is compared with the result produced by the conventional designing method. In FIGS. 8A and 8B, the middle views illustrate light intensity distributions on the image plane: A black part is a light-shielding part, and a white part is a light-transmitting part (illuminated part). Thus, in each of FIGS. 8A and 8B, a set of light intensity distributions that are point-symmetrical with respect to the optical axis on the image plane is formed, and a rectangular (square) modified illumination is obtained. However, as illustrated in the bottom views of FIGS. 8A and 8B, their light intensity distributions are different from each other. In the bottom views (graphs) in FIGS. 8A and 8B, the abscissa axis denotes a longitudinal sectional position by setting the center of the middle view of each of FIGS. 8A and 8B to the origin and the unit is millimeter. The ordinate axis denotes a light intensity distribution normalized to 1 with an arbitrary unit. It is understood that there is a peak corresponding to the center of the square shape.

It is understood that there are many noises in the bottom graph in FIG. 8B, and a leading edge or a trailing edge of the peak of the light intensity distribution deform. The diffraction efficiency is 51% in the conventional designing method and 73% in the designing method according to this embodiment. It is therefore understood that the diffraction efficiency of this embodiment is superior.

It is clear from the above result that this embodiment can provide the two-level DOE configured to efficiently reproduce light intensity distributions point-symmetrical with respect to the optical axis on the image plane with reduced noises.

Fourth Embodiment

Figure 9A:
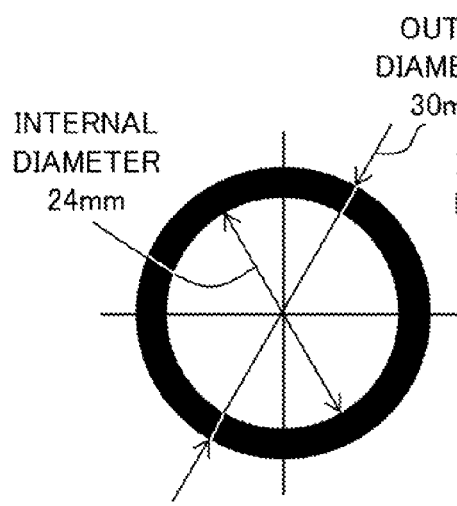
FIGS. 9A and 9B views of a relationship between a target light intensity distribution on an image plane and a light intensity distribution that is a target of an inverse-Fourier transform according to a fourth embodiment.

Assume that the target light intensity distribution has a set of (e.g., semi-annulus) light intensity distributions on the image plane of the optical system, which are point symmetrical with respect to the optical axis of the optical system, as illustrated in FIG. 9A. A black part is a light-transmitting part, and a white part is a light-shielding part. An inner diameter of 24 mm and an outer diameter of 30 mm are merely illustrative.

Figure 9B:
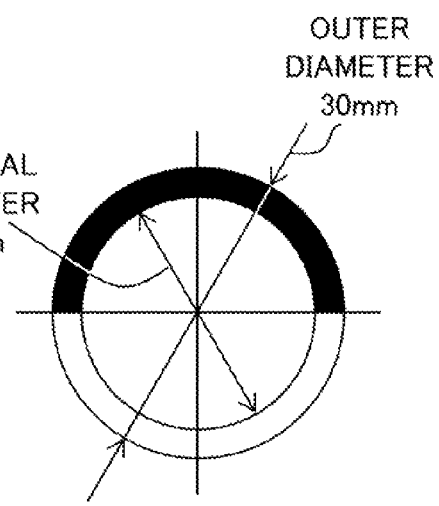

According to the conventional design step, the computer acquires a light intensity distribution and a phase distribution on the DOE plane through an inverse Fourier transform to the light intensity distribution $I_{in}(x,y)$ that contains both light intensity distributions illustrated in FIG. 9A in S120. On the other hand, as illustrated in FIG. 9B, according to the designing step S100 of this embodiment, the computer acquires a light intensity distribution and a phase distribution on the DOE plane through an inverse Fourier transform to the light intensity distribution that contains only one of the light intensity distributions in S120.

This embodiment designs a DOE (CGH) that provides the DOE plane and the image plane with a 2f system utilizing the IFTA. A service wavelength of the light source is 350 nm, the focal length of the Fourier transform lens is 100 nm, the number of pixels of the DOE is 512 pixels×512 pixels, and the size of the unit pixel of the DOE is 250 nm.

FIG. 10A is a result produced by the designing step S100 according to this embodiment, and FIG. 10B is a result produced by the conventional designing method. In FIGS. 10A and 10B, the top views illustrate phase distributions formed by the DOE. It is visually confirmed that they are different from each other when the result produced by the designing method according to this embodiment is compared with the result produced by the conventional designing method. In FIGS. 10A and 10B, the middle views illustrate light intensity distributions on the image plane: A black part is a light-shielding part, and a white part is a light-transmitting part (illuminated part). Thus, in each of FIGS. 10A and 10B, a set of light intensity distributions that are point-symmetrical with respect to the optical axis on the image plane is reproduced, and an annulus modified illumination is obtained. However, as illustrated in the bottom views of FIGS. 10A and 10B, their light intensity distributions are different from each other. In the bottom views (graphs) in FIGS. 10A and 10B, the abscissa axis denotes a longitudinal sectional position by setting the center of the middle view of each of FIGS. 10A and 10B to the origin and the unit is millimeter. The ordinate axis denotes a light intensity distribution normalized to 1 with an arbitrary unit. It is understood that there are two peaks corresponding to the annulus shape.

It is understood that there are many noises in the bottom graph in FIG. 10B, and a leading edge or a trailing edge of the peak of the light intensity distribution deform. The diffraction efficiency is 55% in the conventional designing method and 72% in the designing method according to this embodiment. It is therefore understood that the diffraction efficiency of this embodiment is superior.

It is clear from the above result that this embodiment can provide the two-level DOE configured to efficiently reproduce light intensity distributions point-symmetrical with respect to the optical axis on the image plane with reduced noises.

Fifth Embodiment

Figures 11A, 11B:
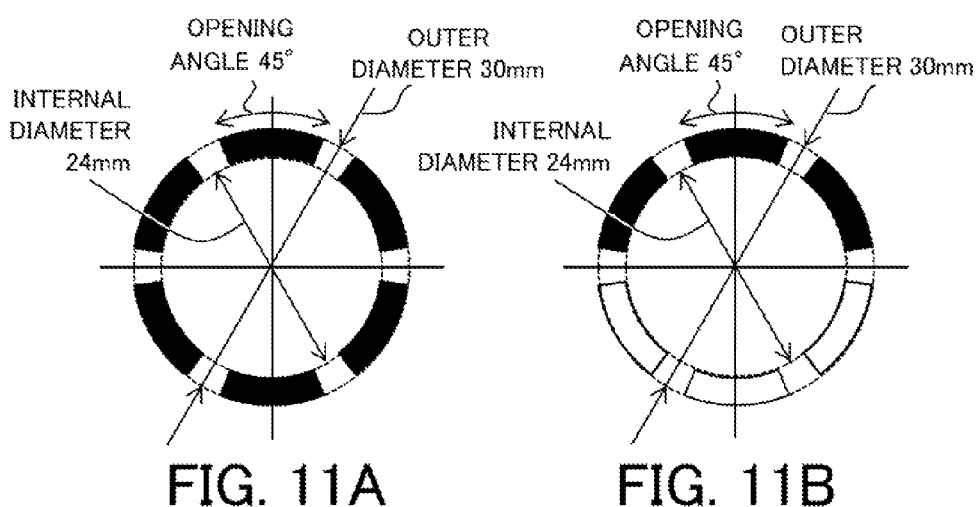
FIGS. 11A and 11B views of a relationship between a target light intensity distribution on an image plane and a light intensity distribution that is a target of an inverse-Fourier transform according to a fifth embodiment.

Assume that the target light intensity distribution has a set of (e.g., upper and lower semi-hexapole) light intensity distributions on the image plane of the optical system, which are point symmetrical with respect to the optical axis of the optical system, as illustrated in FIG. 11A. A black part is a light-transmitting part, and a white part is a light-shielding part. An opening angle of 45°, an inner diameter of 24 mm, and an outer diameter of 30 mm are merely illustrative.

According to the conventional design step, the computer acquires a light intensity distribution and a phase distribution on the DOE plane through an inverse Fourier transform to the light intensity distribution $I_{in}(x,y)$ that contains both light intensity distributions illustrated in FIG. 11A in S120. On the other hand, as illustrated in FIG. 11B, according to the designing step S100 of this embodiment, the computer acquires a light intensity distribution and a phase distribution on the DOE plane through an inverse Fourier transform to the light intensity distribution that contains only one of the set of light intensity distributions in S120.

This embodiment designs a DOE (CGH) that provides the DOE plane and the image plane with a 2f system, utilizing the IFTA. A service wavelength of the light source is 350 nm, a focal length of the Fourier transform lens is 100 nm, the number of pixels of the DOE is 512 pixels×512 pixels, and the size of the unit pixel of the DOE is 250 nm.

FIG. 12A is a result produced by the designing step S100 according to this embodiment, and FIG. 12B is a result produced by the conventional designing method. In FIGS. 12A and 12B, the top views illustrate phase distributions formed by the DOE. It is visually confirmed that they are different from each other when the result produced by the designing method according to this embodiment is compared with the result produced by the conventional designing method. In FIGS. 12A and 12B, the middle views illustrate light intensity distributions on the image plane: A black part is a light-shielding part, and a white part is a light-transmitting part (illuminated part). Thus, in each of FIGS. 12A and 12B, a set of light intensity distributions that are point-symmetrical with respect to the optical axis on the image plane is reproduced, and hexapole (sextet-pole) modified illumination is obtained. However, as illustrated in the bottom views of FIGS. 12A and 12B, their light intensity distributions are different. In the bottom views (graphs) in FIGS. 12A and 12B, the abscissa axis denotes a longitudinal sectional position by setting the center of the middle view of each of FIGS. 12A and 12B to the origin and the unit is millimeter. The ordinate axis denotes a light intensity distribution normalized to 1 with an arbitrary unit. It is understood that there are two peaks corresponding to the hexapole.

It is understood that there are many noises in the bottom graph in FIG. 12B, and a leading edge or a trailing edge of the peak of the light intensity distribution deform. The diffraction efficiency is 51% in the conventional designing method and 72% in the designing method according to this embodiment. It is therefore understood that the diffraction efficiency of this embodiment is superior.

It is clear from the above result that this embodiment can provide the two-level DOE configured to efficiently reproduce light intensity distributions point-symmetrical with respect to the optical axis on the image plane with reduced noises.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The present invention is applicable to the manufacturing method of the DOE and the manufactured DOE is applicable to an imaging optical system configured to form an image on the optical axis.

This application claims the benefit of Japanese Patent Application No. 2012-052360, filed Mar. 8, 2012, which is hereby incorporated by reference herein in its entirety.

What is claimed is:

1. A calculating method for calculating structural data of a two-level diffractive optical element configured to form a set of light intensity distributions point-symmetrical with respect to an axis on an image plane utilizing an iterative Fourier transform algorithm executed by a computer, the calculating method comprising:
   a first step of calculating a light intensity distribution and a phase distribution of a plane of the two-level diffractive optical element which has a Fourier transform relationship with the image plane by performing an inverse Fourier transform for a light intensity that is made by removing one of the set of light intensity distributions from the set of light intensity distributions; and
   a second step of calculating structural data of the diffractive optical element based upon the light intensity distribution and the phase distribution which have been calculated.

2. The calculating method according to claim 1, further comprising a third step of calculating a light intensity distribution that is made by removing one of the set of the light intensity distribution from the set of light intensity distributions that are input, utilizing the computer.

3. The calculating method according to claim 1, further comprising the steps of:
   a fourth step of providing a constraint condition so as to set the light intensity distribution to 1 and to make the phase distribution binary obtained from the first step;
   a fifth step of performing a Fourier transform for the light intensity distribution and the phase distribution that are obtained by the fourth step so as to calculate a light intensity distribution and a phase distribution on the image plane;
   a sixth step of replacing the light intensity distribution on the image plane obtained by the fifth step to a target light intensity distribution on the image plane; and
   a seventh step of performing the inverse Fourier transform for the target light intensity distribution on the image plane and the phase distribution on the image plane obtained by the fifth step,
   wherein a loop of the fourth step, the fifth step, the sixth step, and the seventh step is repeated.

4. A non-transitory computer-readable medium for calculating structural data of a two-level diffractive optical element configured to form a set of light intensity distributions point-symmetrical with respect to an axis on an image plane utilizing an iterative Fourier transform algorithm, comprising instructions stored thereon, that when executed on a processor, perform the steps of:
   a first step of calculating a light intensity distribution and a phase distribution of a plane of the two-level diffractive optical element which has a Fourier transform relationship with the image plane by performing an inverse Fourier transform for a light intensity that is made by removing one of the set of light intensity distributions from the set of light intensity distributions; and
   a second step of calculating structural data of the diffractive optical element based upon the light intensity distribution and the phase distribution which have been calculated.

5. A method comprising the steps of:
   calculating structural data of a two-level diffractive optical element configured to form a set of light intensity distributions point-symmetrical with respect to an axis on an image plane utilizing an iterative Fourier transform algorithm executed by a computer, the calculating including:

a first step of calculating a light intensity distribution and a phase distribution of a plane of the two-level diffractive optical element which has a Fourier transform relationship with the image plane by performing an inverse Fourier transform for a light intensity that is made by removing one of the set of light intensity distributions from the set of light intensity distributions, and a second step of calculating structural data of the diffractive optical element based upon the light intensity distribution and the phase distribution which have been calculated; and manufacturing the two-level diffractive optical element using the calculated structural data.

* * * * *